United States Patent
Kang

(10) Patent No.: US 7,408,799 B2
(45) Date of Patent: Aug. 5, 2008

(54) RFID DEVICE HAVING NONVOLATILE FERROELECTRIC MEMORY DEVICE

(75) Inventor: Hee Bok Kang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 33 days.

(21) Appl. No.: 11/525,812

(22) Filed: Sep. 25, 2006

(65) Prior Publication Data

US 2007/0195577 A1 Aug. 23, 2007

(30) Foreign Application Priority Data

Feb. 17, 2006 (KR) ...................... 10-2006-0015663

(51) Int. Cl.
*G11C 11/22* (2006.01)
*G11C 11/24* (2006.01)
(52) U.S. Cl. ...................... 365/145; 365/149
(58) Field of Classification Search ................ 365/145, 365/149
See application file for complete search history.

(56) References Cited

U.S. PATENT DOCUMENTS

| | | | |
|---|---|---|---|
| 5,014,240 A | | 5/1991 | Suzuki |
| 5,892,706 A | * | 4/1999 | Shimizu et al. ............. 365/145 |
| 5,943,256 A | * | 8/1999 | Shimizu et al. ............. 365/145 |
| 6,294,997 B1 | | 9/2001 | Paratore et al. |
| 6,594,174 B2 | * | 7/2003 | Choi et al. .................. 365/145 |
| 6,687,150 B1 | * | 2/2004 | Joachim et al. ............. 365/145 |
| 6,707,700 B2 | | 3/2004 | Kang |
| 6,707,704 B2 | * | 3/2004 | Kato et al. .................. 365/145 |
| 6,721,198 B2 | * | 4/2004 | Kang ......................... 365/145 |
| 6,721,199 B2 | * | 4/2004 | Kang ......................... 365/145 |
| 6,760,247 B2 | * | 7/2004 | Komatsuzaki ............... 365/145 |
| 6,809,952 B2 | * | 10/2004 | Masui ........................ 365/145 |
| 6,873,536 B2 | * | 3/2005 | Komatsuzaki ............... 365/145 |
| 6,912,149 B2 | * | 6/2005 | Yamaoka et al. ............ 365/145 |
| 6,999,335 B2 | * | 2/2006 | Murakuki ................... 365/145 |
| 7,106,616 B2 | * | 9/2006 | Takahashi ................... 365/145 |
| 7,120,043 B2 | * | 10/2006 | Kang ......................... 365/145 |
| 7,120,045 B2 | * | 10/2006 | Lee et al. .................... 365/145 |
| 7,130,211 B2 | * | 10/2006 | Kang ......................... 365/145 |
| 7,212,429 B2 | * | 5/2007 | Kang ......................... 365/145 |
| 7,274,608 B2 | * | 9/2007 | Takahashi ................... 365/145 |
| 7,280,384 B2 | * | 10/2007 | Suzuki ....................... 365/145 |
| 7,310,262 B2 | * | 12/2007 | Nishihara et al. ........... 365/145 |
| 2005/0195639 A1 | | 9/2005 | Fukushi et al. |

\* cited by examiner

*Primary Examiner*—Trong Phan
(74) *Attorney, Agent, or Firm*—Finnegan, Henderson, Farabow, Garrett & Dunner, L.L.P.

(57) ABSTRACT

A nonvolatile ferroelectric memory in an RFID device includes a plurality of word lines, and a plurality of banks each including a cell array. The cell array of one of the banks includes a region to be initialized, wherein the region includes a plurality of memory unit cells each including a ferroelectric capacitor, the memory unit cells being connected to the word lines. The ferroelectric capacitor of a first one of the memory unit cells is connected between a plate line and a cell transistor. The ferroelectric capacitor of a second one of the memory unit cells has one terminal connected to a ground terminal. The first one and the second one of the memory cells are respectively connected to a first one and a second one of the word lines, the first one and the second one of the word lines being connected to each other.

19 Claims, 8 Drawing Sheets

RFID DEVICE HAVING NONVOLATILE FERROELECTRIC MEMORY DEVICE

RELATED APPLICATION

This application is based upon and claims the benefit of priority to Korean Application No. KR10-2006-0015663, filed on Feb. 17, 2006, the entire contents of which are incorporated herein by reference.

BACKGROUND

1. Technical Field

The present invention generally relates to an RFID (radio frequency identification) device having a nonvolatile ferroelectric memory, and more specifically, to a technology of setting and changing an initialization condition of a specific memory cell array region of a memory of an RFID device.

2. Description of the Related Art

Recently, RFID devices have been used in physical distribution administration systems, user authentication systems, electronic cash systems, and traffic systems. For example, goods are classified or administrated with IC (integrated circuit) tags where data are recorded, instead of a delivery bill or a tag in physical distribution administration systems. For another example, user authentication systems performs check-in administrations with an IC card where personal information is recorded.

In general, a nonvolatile ferroelectric memory is used as a memory of the RFID devices. Among different types of nonvolatile ferroelectric memory devices, ferroelectric random access memory (hereinafter, referred to as 'FeRAM') devices have attracted considerable attention as a next generation memory device because it has a data processing speed as fast as a Dynamic Random Access Memory (hereinafter, referred to as 'DRAM') and conserves data even after the power is turned off. An FeRAM having a structure similar to that of a DRAM includes capacitors made of a ferroelectric substance, which has a high residual polarization allowing for data retention after power is turned off.

SUMMARY

Various embodiments consistent with the present invention are directed at providing an RFID device including a region in a common memory that can be initialized.

Various embodiments consistent with the present invention are directed at providing an RFID device for forming a region that can be initialized within a common memory.

Various embodiments consistent with the present invention are directed at providing a RFID device for forming a region that can be initialized by the same process as a common memory.

Consistent with embodiments of the present invention, a nonvolatile ferroelectric memory in an RFID device includes a plurality of word lines, and a plurality of banks each including a cell array. The cell array of one of the banks includes a region to be initialized, wherein the region includes a plurality of memory unit cells each including a ferroelectric capacitor, the memory unit cells being connected to the word lines. The ferroelectric capacitor of a first one of the memory unit cells is connected between a plate line and a cell transistor. The ferroelectric capacitor of a second one of the memory unit cells has one terminal connected to a ground terminal. The first one and the second one of the memory cells are respectively connected to a first one and a second one of the word lines, the first one and the second one of the word lines being connected to each other.

Consistent with embodiments of the present invention, a nonvolatile ferroelectric memory in an RFID device includes a plurality of word lines, and a plurality of banks each including a cell array, the cell array of one of the banks including a region to be initialized, the region including a plurality of memory unit cells each including a ferroelectric capacitor, wherein the memory unit cells are connected to the word lines. The ferroelectric capacitor of a first one of the memory unit cells has a first terminal connected to a plate line and a second terminal connected to a cell transistor. The ferroelectric capacitor of a second one of the memory unit cells has one terminal connected to a ground voltage. The first one and the second one of the memory cells are respectively connected to a first one and a second one of the word lines, the first one and the second one of the word lines being selected by a same row address.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
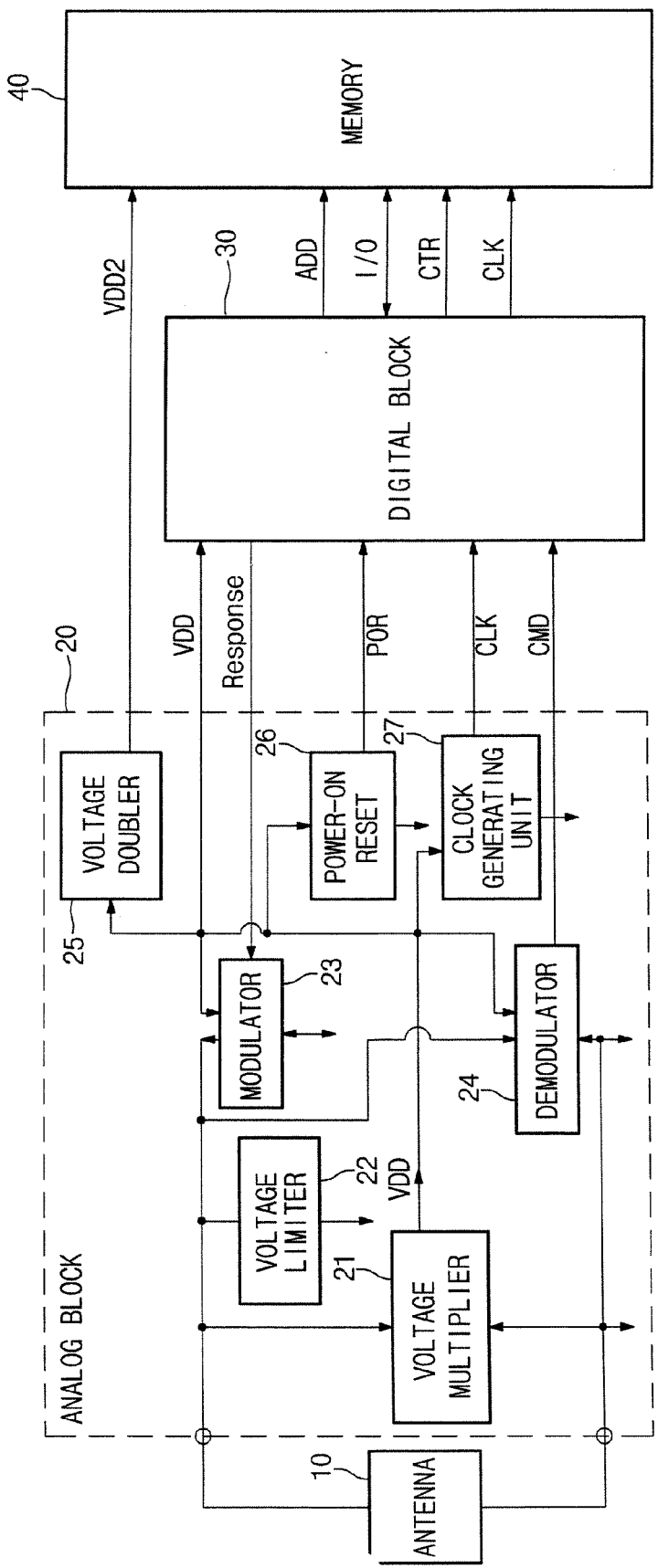
FIG. 1 is a diagram illustrating an RFID device consistent with the present invention.

FIG. 1 is a diagram illustrating an RFID device consistent with the present invention.

The RFID device includes an antenna 10, an analog block 20, a digital block 30, and a memory 40.

The antenna 10 transmits and receives radio frequency signals to an external reader or from an external writer.

The analog block 20 includes a voltage multiplier 21, a voltage limiter 22, a modulator 23, a demodulator 24, a voltage doubler 25, a power-on reset unit 26, and a clock generating unit 27.

The voltage multiplier 21 generates a power voltage VDD for the RFID device in response to the radio frequency signal received from the antenna 10.

The voltage limiter 22 limits a voltage of the radio frequency signal received from the antenna 10.

The modulator 23 modulates a response signal Response received from the digital block 30 and to be transmitted to the antenna 10.

The demodulator 24 detects an operation command signal CMD within the radio frequency signal received from the antenna 10 and outputs the command signal CMD to the digital block 30.

The voltage doubler 25 boosts the power voltage VDD provided by the voltage multiplier 21 to a boosted voltage VDD2, which has a swing width twice that of the power voltage VDD, and provides the boosted voltage VDD2 to the memory 40.

The power-on reset unit 26 senses the power voltage VDD provided by the voltage multiplier 21 and outputs a power-on reset signal POR to control a reset operation of the digital block 30.

The clock generating unit 27 generates a clock signal CLK.

The digital block 30 receives the power voltage VDD, the power-on reset signal POR, the clock signal CLK, and the command signal CMD from the analog block 20, and outputs the response signal Response to the analog block 20. The digital block 30 outputs an address ADD, data I/O, a control signal CTR, and the clock signal CLK to the memory 40.

The memory 40 has a plurality of memory cells each including a nonvolatile ferroelectric capacitor.

The analog block 20 and the digital block 30 of the above-described RFID device are driven only by the low voltage VDD while the memory 40 requires the high voltage VDD2.

Figure 2:
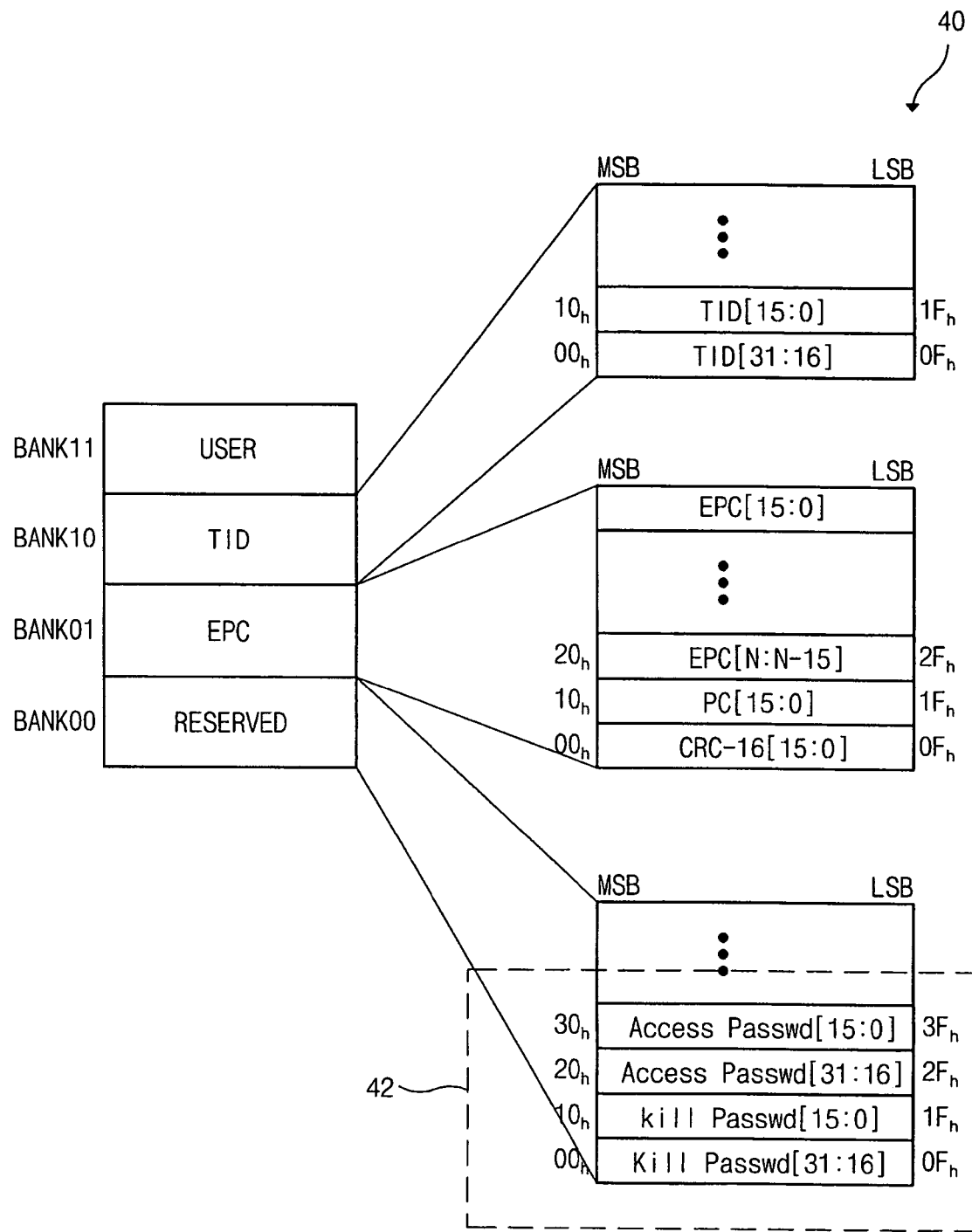
FIG. 2 is a block diagram illustrating a memory of FIG. 1.

FIG. 2 is a block diagram illustrating the memory 40 of FIG. 1.

The memory 40 includes a plurality of memory blocks (not shown), and is composed of four bank regions, i.e., BANK00 (RESERVED), BANK01 (EPC: Electronic Product Code), BANK10 (TID: Tag Identification), and BANK11 (USER). Bank region BANK01 includes a protocol control area (PC) and cyclic redundancy check area (CRC). BANK00 includes a reserved memory area (RESERVED) where a kill password and an access password are stored. The kill password, when set to a certain value, render the RFID tag unusable, and helps protect the privacy of the data stored in the RFID tag in certain environments. Prior to such time when the user intends to destruct or lock the RFID tag, the kill password should not be set to the certain value. Instead, the memory 40 is configured to store a predetermined initial value in the manufacturing stage. Therefore a portion of the memory 40 of FIG. 2 needs to be initialized with an initial value, which can be modified later, when, e.g., the certain value of the kill password should be written to destruct or lock the RFID tag. And the memory 40 includes a cell array 42.

The reserved memory area includes the cell array 42. The cell array 42 includes a kill password (Kill Passwd[31:16]) ran in from $00_h$ to $0F_h$, a kill password (Kill Passwd[15:0] ranging from $10_h$ to $1F_h$, an access password (Access Passwd [31:16]) ranging from $20_h$ to $2F_h$, and an access password (Access Passwd[15:0]) ranging from $30_h$ to $3F_h$, from most significant bit (MSB) to least significant bit (LSB). The Electronic Product Code (EPC) includes a cyclic redundancy check area (CRC-16[15:0]) ranging from $00_h$ to $0F_h$, a protocol control area (PC[15:0]) ranging from $10_h$ to $1F_h$, an electronic product code (EPC[N:N-15]) ranging from $20_h$ to $1F_h$, and at least another electronic product code (EPC[15:0]). The Tag Identification (TID) area includes a tag identification (TID[31:16]) ranging from $00_h$ to $0F_h$ and a tag identification (TID[15:0]) ranging from $10_h$. to $1F_h$.

Figure 3:
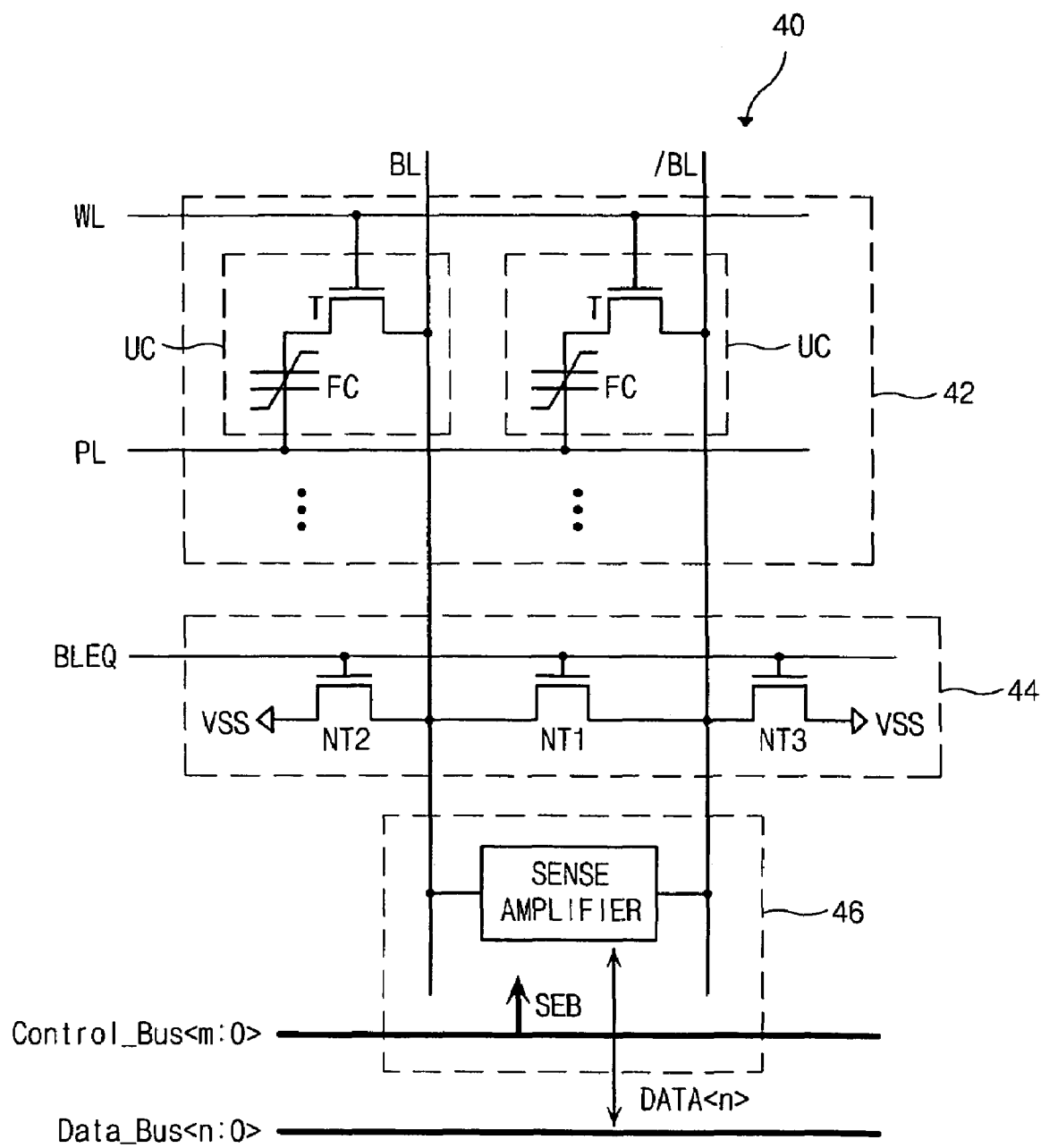
FIG. 3 is a circuit diagram illustrating a memory block of a bank of FIG. 2.

FIG. 3 is a circuit diagram illustrating a memory block of each bank of FIG. 2.

The memory cell block of FIG. 3 includes a cell array 42, a bit line pull-down unit 44, and a sense amplifier 46.

The cell array 42 includes a plurality of unit cells UC each configured to store data depending on a voltage applied to a word line WL and a plate line PL or to output the stored data into a true bit line BL. Here, each unit cell UC includes a cell transistor T and a ferroelectric capacitor FC.

The bit line pull-down unit 44 includes an equalization unit NTI configured to equalize a pair of bit lines BL and /BL, where the bit line BL is a true bit line and the bit line /BL is a complement bit line carrying a signal that is the invert of the signal on the true bit line BL, in response to a bit line equalizing signal BLEQ, and NMOS transistors NT2 and NT3 configured to pull down the pair of bit lines BL and /BL to a ground voltage VSS.

The sense amplifier 46 amplifies data in the true bit line BL in response to a control signal SEB applied from a control bus Control_Bus<m:0> and outputs the data DATA<n> into a data bus Data_Bus<n:0> or transmits data DATA<n> in the data bus Data_Bus<n:0> onto the pair of bit lines BL and /BL.

Figure 4A:
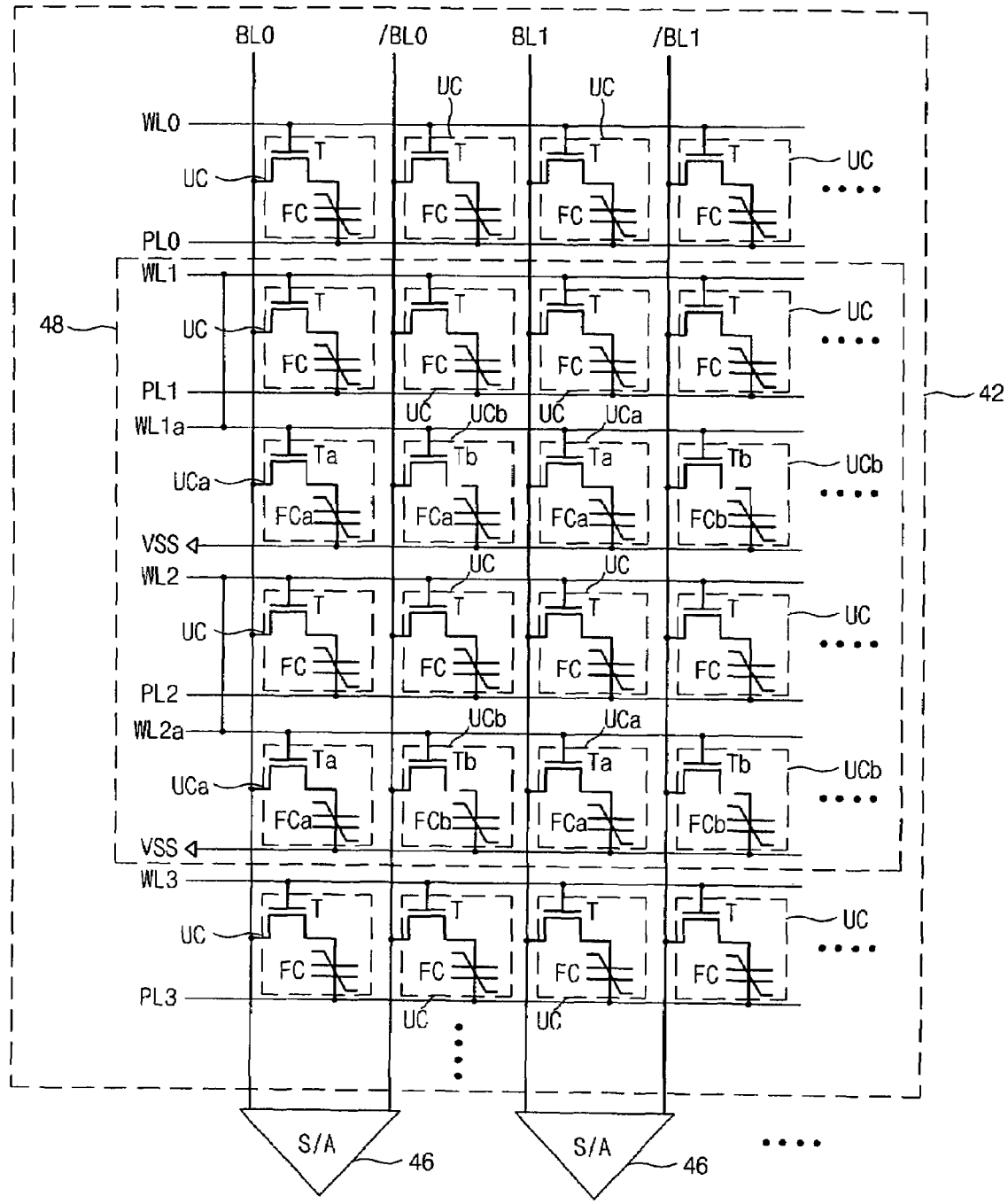
FIG. 4a is a circuit diagram illustrating a sense amplifier and a configuration of a cell array of FIG. 3 consistent with a first embodiment of the present invention.

FIG. 4a is a circuit diagram illustrating the sense amplifier 46 and a configuration of the cell array 42 of FIG. 3 consistent with a first embodiment of the present invention. FIG. 4a shows that the cell array 42 has a folded bit line structure.

The cell array 42 includes a first region 48 that requires initialization and a second region (not numbered) composed of the rest of the cell array 42 that does not require initialization. The second region includes memory unit cells for storing data. The second region also includes a plurality of unit cells respectively connected to two word lines, WL0, WL3 and two plate lines PL0, PL3. The first region 48 includes a plurality of unit cells respectively connected to four word lines, WL1, WL1a, WL2, and WL2a, where the word lines WL1 and WL1a are connected to each other, and the word lines WL2 and WL2a are connected to each other. The first region 48 is driven by a common word line driving unit (not shown).

As FIG. 4a shows, each of the unit cells connected to the word lines WL1 and WL2, identified as unit cells UC, includes a ferroelectric capacitor FC having one terminal connected to a plate line PL1 or PL2; each of the unit cells connected to both the word lines WL1a and WL2a and the true bit lines, e.g., BL0 and BL1, identified as unit cells UCa, includes a ferroelectric capacitor FCa having one terminal connected to a ground voltage terminal VSS; and each of the unit cells connected to both the word lines WL1a and WL2a and the complement bit lines, e.g., /BL0 and /BL1, identified as unit cells UCb, includes a ferroelectric capacitor FCa with one terminal to a ground voltage terminal VSS and the other terminal floating. The other terminal of the ferroelectric capacitor FC or FCa of each of the unit cells UC and UCa is connected to a cell transistor T or Ta of the corresponding unit cell.

The ferroelectric capacitors FC of the unit cells UC connected to the word lines WL1 and WL2 store data. The ferroelectric capacitors FCa of the unit cells UCa connected to the word lines WL1a and WL2a and the true bit lines, e.g., BL0 and BL1, increase the capacitance of the corresponding true bit line BL.

When the word line WL1 or WL2 in the first region 48 is selected, the capacitance of the selected bit lines BL0 and BL1 becomes larger than that of the complement bit lines /BL0 and /BL1 so that output data of the sense amplifier 46 are initialized to a low level "0".

Although not shown in FIG. 4a, the memory cell array 42 may be configured in an alternative manner so that the sense amplifier 46 outputs a high level "1" during initialization. More specifically, the ferroelectric capacitor FCa of each of the unit cells UCa may be disconnected from the corresponding cell transistor Ta, while the ferroelectric capacitor FCb of each of the unit cells UCb is connected to the corresponding cell transistor Tb. Thus, when the word line WL1 or WL2 of the first region 48 is selected, the capacitance of the selected true bit lines BL0 and BL1 becomes smaller than that of the complement bit lines /BL0 and /BL1 so that output data of the sense amplifier 46 are initialized to a high level "1".

Figure 4B:
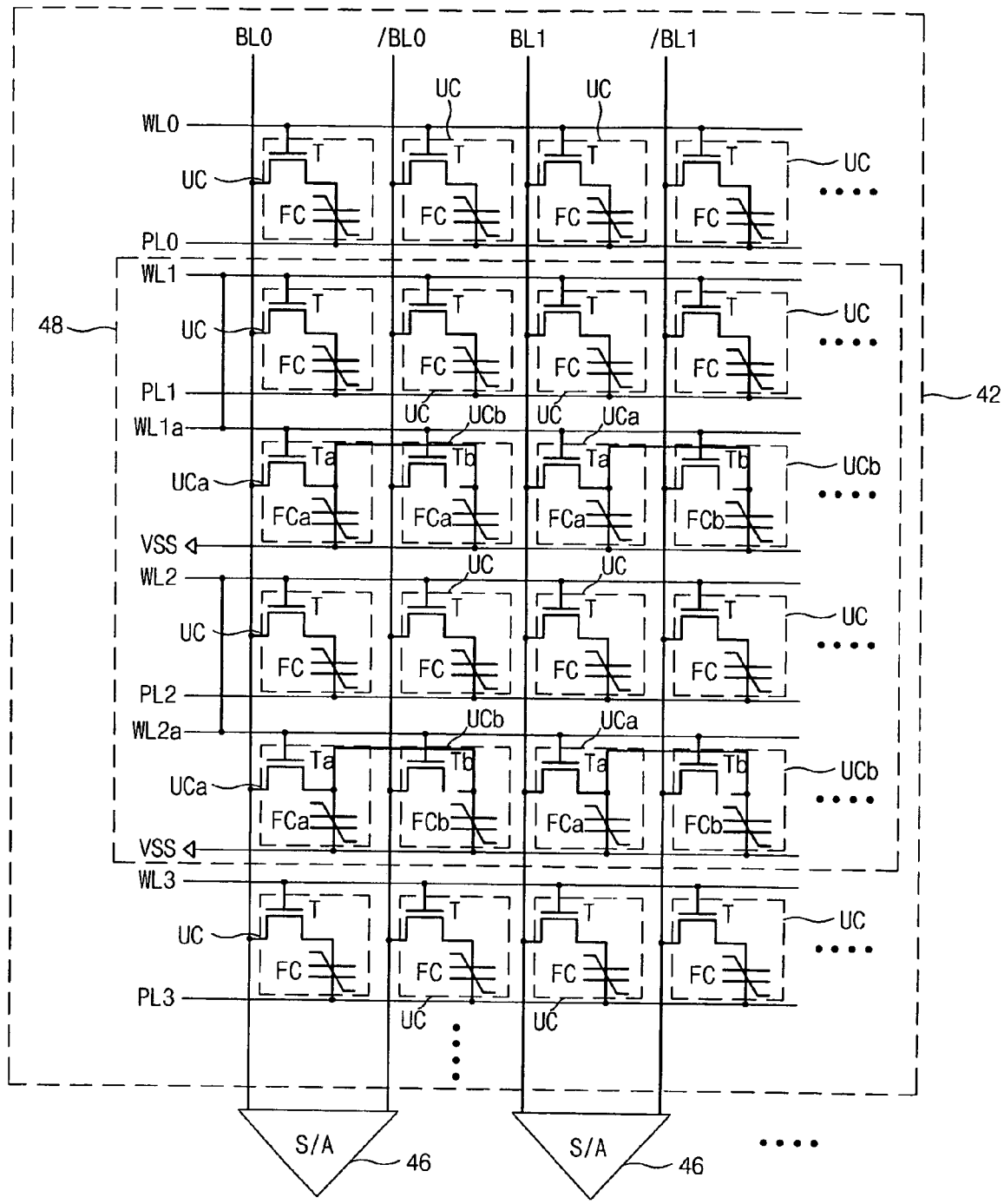
FIG. 4b is a circuit diagram illustrating a sense amplifier and a configuration of a cell array of FIG. 3 consistent with a second embodiment of the present invention.

FIG. 4b is a circuit diagram illustrating the sense amplifier 46 and a configuration of the cell array 42 of FIG. 3 consistent with a second embodiment of the present invention. FIG. 4b also shows that the cell array 42 has a folded bit line structure.

The cell array 42 includes a first region that requires initialization and a second region (not numbered) composed of the rest of the cell array 42 that does not require initialization. The second region includes memory unit cells for storing data. The second region also includes a plurality of unit cells respectively connected to two word lines, WL0, WL3 and two plate lines PL0, PL3. The first region 48 includes a plurality of unit cells respectively connected to four word lines, WL1, WL1a, WL2, and WL2a, where the word lines WL1 and WL1a are connected to each other, and the word lines WL2 and WL2a are connected to each other. The first region 48 is driven by a common word line driving unit (not shown).

As FIG. 4b shows, each of the unit cells connected to the word lines WL1 and WL2, identified as unit cells UC, includes a ferroelectric capacitor FC having one terminal connected to a plate line PL1 or PL2; each of the unit cells connected to both the word lines WL1a and WL2a and the true bit lines, e.g., BL0 and BL1, identified as unit cells UCa, includes a ferroelectric capacitor FCa having one terminal connected to a ground voltage terminal VSS; and each of the unit cells connected to both the word lines WL1a and WL2a and the complement bit lines, e.g., /BL0 and /BL1, identified as unit cells UCb, includes a ferroelectric capacitor FCa having one terminal connected to the ground voltage terminal VSS. The other terminal of the ferroelectric capacitor FC or FCa of each of the unit cells UC and UCa is connected to a cell transistor T or Ta of the corresponding unit cell, and the other terminal of the ferroelectric capacitor FCb of each of the unit cells UCb is connected to the other terminal of the ferroelectric capacitor FCa of a corresponding unit cell UCa.

The ferroelectric capacitors FC of the unit cells UC connected to the word lines WL1 and WL2 store data. The ferroelectric capacitors FCa and FCb of the unit cells UCa and UCb are both connected to the true bit lines, e.g., BL0 and BL1, thereby increasing the capacitance of the corresponding true bit line BL.

As a result, when the word line WL1 or WL2 of the initialization requiring region 48 is selected, the capacitance of the selected true bit line BL0 and BL1 becomes higher than that of the complement bit lines /BL0 and /BL1 so that output data of the sense amplifier 46 are initialized to a low level "0".

More specifically, the ferroelectric capacitor FCa of each of the unit cells UCa may be disconnected from the corresponding cell transistor Ta, while the ferroelectric capacitor FCb of each of the unit cells UCb is connected to the corresponding cell transistor Tb. Thus, when the word line WL1 or WL2 of the first region 48 is selected, the capacitance of the selected true bit lines BL0 and BL1 becomes smaller than that of the complement bit lines /BL0 and /BL1 so that output data of the sense amplifier 46 are initialized to a high level "1".

Although not shown in FIG. 4b, the memory cell array 42 may be configured in an alternative manner so that the sense amplifier 46 outputs a high level "1" during initialization. More specifically, the ferroelectric capacitors FCa and FCb of the corresponding pair of unit cell UCa and unit cell UCb may be both disconnected from the cell transistor Ta of that unit cell UCa but connected to the cell transistor Tb of that unit cell UCb. Thus, when the word line WL1 or WL2 of the initialization requiring region 48 is selected, the capacitance of the selected true bit lines BL0 and BL1 becomes smaller than that of the complement bit lines /BL0 and /BL1 so that output data of the sense amplifier 46 are initialized to a high level "1".

Figure 5:
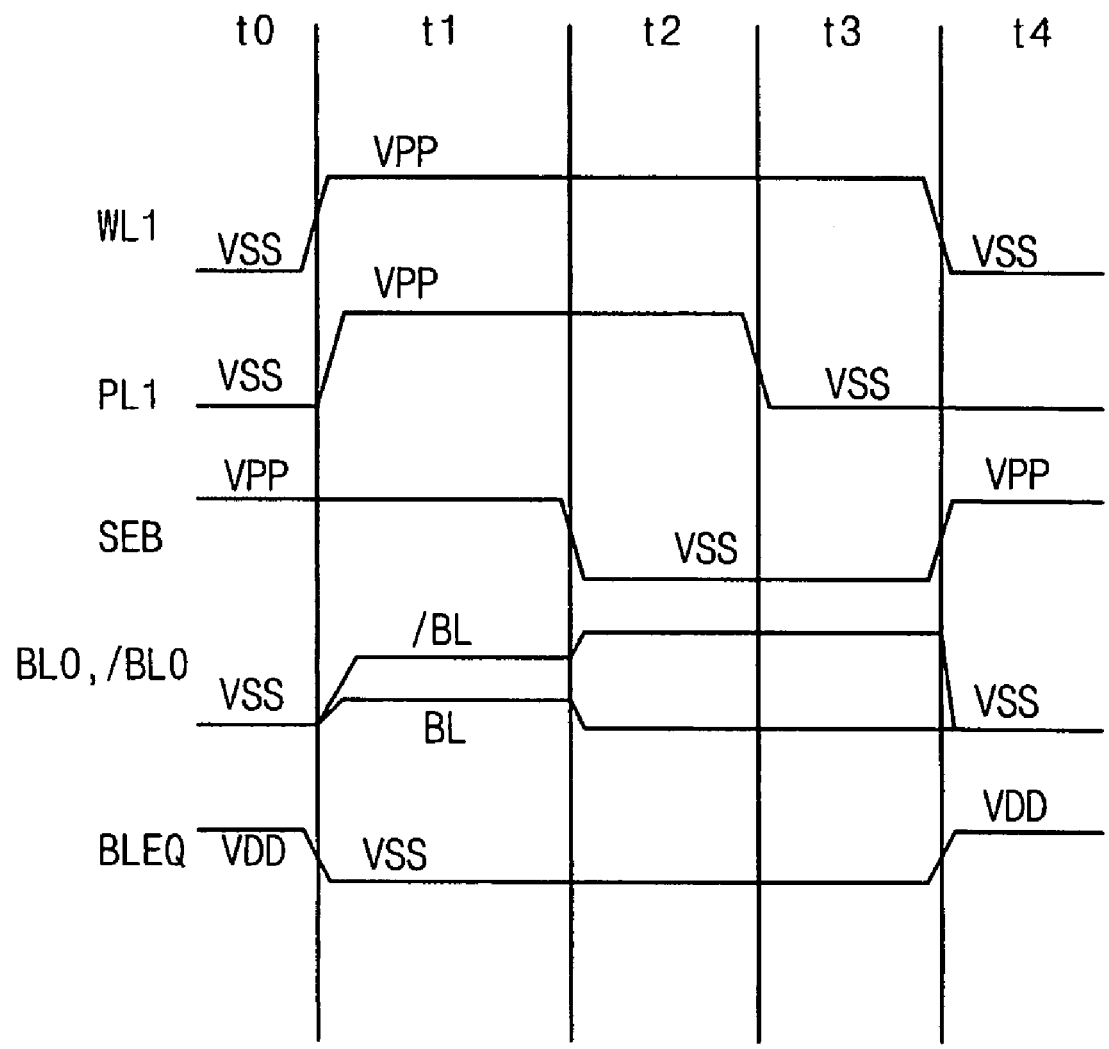
FIG. 5 is a timing diagram illustrating a read operation of a memory consistent with embodiments of the present invention.

FIG. 5 is a timing diagram illustrating a read operation of the memory 40 as shown in FIGS. 3 and 4a consistent with the present invention. Therefore, the memory cell 40 is initialized to output the low level data "0" during initialization. FIG. 5 only shows the word line WL1 and the bit lines BL0 and /BL0 as an example.

In a period t0, the bit line equalizing signal BLEQ is activated so that the pair of bit lines BL0 and /BL0, the word line WL1, and the plate line PL1 are precharged to the ground voltage VSS.

In a period t1, when the bit line equalizing signal BLEQ becomes the ground voltage level VSS, and the word line WL1 and the plate line PL1 are activated to a high voltage VPP, a voltage difference is generated by a capacitance difference between the pair of bit lines BL0 and /BL0. That is, a potential of the true bit line BL0 is lower than that of the complement bit line /BL0 having a relatively smaller capacitance.

In a period t2, a sense amplifier enable signal SEB transits from the high voltage level VPP to the ground voltage VSS so that the sense amplifier 46 senses and amplifies a voltage difference of the paired bit lines BL0 and /BL0. As a result, the low level data "0" are written in all unit cells.

In a period t3, the plate line PL1 becomes at the ground voltage level VSS so that the high level data "1" is restored in the memory cell where the high level data "1" is stored.

In a period t4, the word line WL1 becomes at the ground voltage level VSS, the sense amplifier enable signal SEB becomes at the high voltage level VPP, and the bit line equalizing signal BLEQ becomes at the power voltage level VDD so that the pair of bit lines BL0 and /BL0 are set at the ground voltage VSS.

If, alternatively, the ferroelectric capacitors FCa are connected to the corresponding complement bit lines, e.g., /BL0, the high level data "1" are initialized. Then the memory cell 40 may be read as shown in FIG. 5.

Figure 6A:
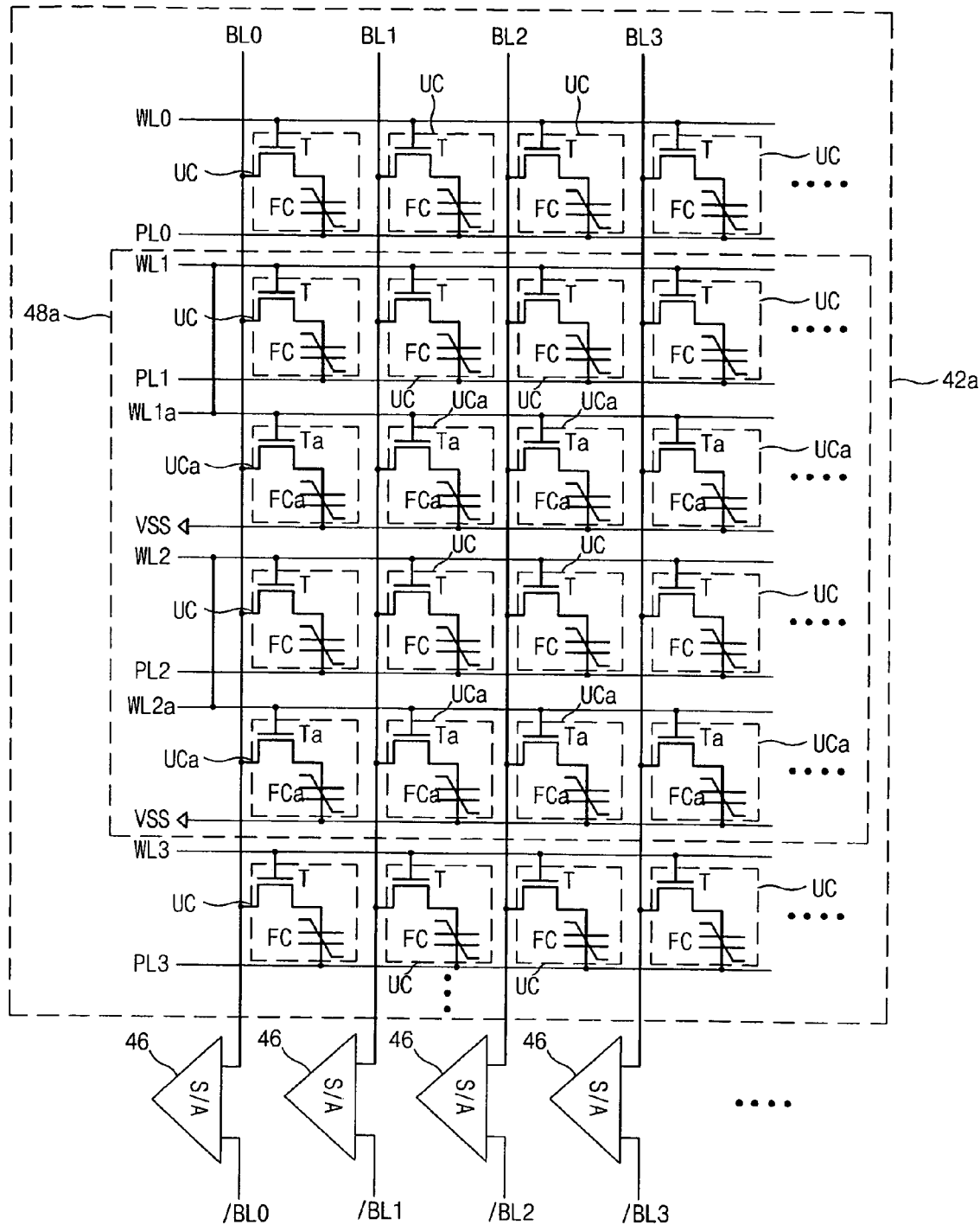
FIGS. 6a and 6b are circuit diagrams illustrating a sense amplifier and a configuration of a cell array of FIG. 3 consistent with a third embodiment of the present invention.
Figure 6B:
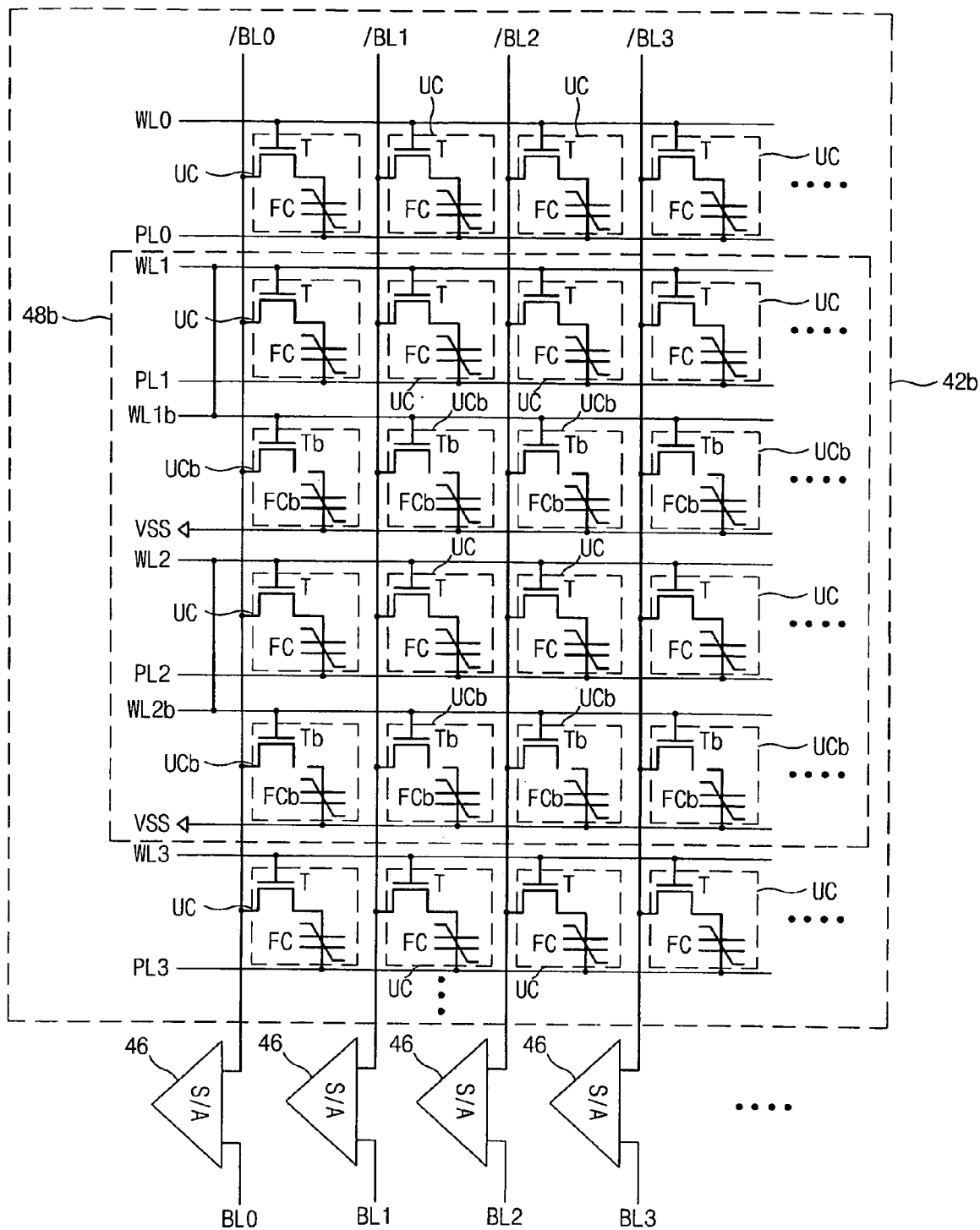

FIGS. 6a and 6b are circuit diagrams illustrating the sense amplifier 46 and a configuration of the cell array 42 of FIG. 3 consistent with a third embodiment of the present invention. It is assumed that the cell array 42 has an open bit line structure with a true bit line region 42a and a complement bit line region 42b separated from each other, where the true bit line region 42a includes the true bit lines and the complement bit line region 42b includes the complement bit lines. FIG. 6a shows the true bit region 42a, and FIG. 6b shows the complement bit line region 42b.

The true bit line region 42a includes a first region 48a that requires initialization and a second region (not numbered) composed of the rest of the true bit line region 42a that does not require initialization. The second region includes memory unit cells for storing data. The second region also includes a plurality of unit cells respectively connected to two word lines, WL0, WL3 and two plate lines PL0, PL3. The first region 48a includes a plurality of unit cells respectively connected to four word lines, WL1, WL1a, WL2, and WL2a, where the word lines WL1 and WL1a are connected to each other, and the two word lines WL2 and WL2a are connected to each other. The first region 48a is driven by a common word line driving unit (not shown).

As FIG. 6a shows, each of the unit cells connected to the word lines WL1 and WL2, identified as unit cells UC, includes a ferroelectric capacitor FC having one terminal connected to a plate line PL1 or PL2; each of the unit cells connected to the word lines WL1a and WL2a, identified as unit cells UCa, includes a ferroelectric capacitor FCa having one terminal connected to a ground voltage terminal VSS. The other terminal of the ferroelectric capacitor FC or FCa of each of the unit cells UC and UCa is connected to a cell transistor T or Ta of the corresponding unit cell.

The ferroelectric capacitors FC of the unit cells UC connected to the word lines WL1 and WL2 store data. The ferroelectric capacitors FCa of the unit cells UCa connected to the word lines WL1a and WL2a and also connected to the true bit lines, e.g., BL0 and BL1, increase capacitance of the corresponding true bit lines BL.

The complement bit line region 42b also includes a first region 48b that requires initialization and a second region (not numbered) composed of the rest of the complement bit line region 42a that does not require initialization. The second region includes memory unit cells for storing data. The second region also includes a plurality of unit cells respectively connected to two word lines, WL0, WL3 and two plate lines PL0, PL3. The first region 48b includes a plurality of unit cells respectively connected to four word lines, WL1, WL1b, WL2, and WL2b, where the word lines WL1 and WL1b are connected to each other, and the word lines WL2 and WL2b are connected to each other. The first region 48b is driven by a common word line driving unit (not shown).

As FIG. 6b shows, each of the unit cells connected to the word lines WL1 and WL2, identified as unit cells UC, includes a ferroelectric capacitor FC having one terminal connected to a plate line PL1 or PL2; and each of the unit cells connected to the word lines WL1b and WL2b, identified as unit cells UCb, includes a ferroelectric capacitor FCa having one terminal connected to a ground voltage terminal VSS. The other terminal of the ferroelectric capacitor FC of each of the unit cells UC is connected to a cell transistor T of the corresponding unit cell. The other terminal of the ferroelectric capacitor FCb of each of the unit cells UCb is floating.

As shown in FIGS. 6a and 6b, the capacitance of the complement bit lines /BL0, /BL1, /BL2 and /BL3 is not increased because the ferroelectric capacitors FCb of the unit cells UCb are not connected to the corresponding complement bit lines. Thus, when the word line WL1 or WL2 of the initialization requiring region 48 is selected, the capacitance of the selected true bit lines becomes larger than that of the corresponding complement bit lines so that the output data of the sense amplifier 46 are initialized to the low level "0".

Although not shown in FIGS. 6a and 6b, the memory cell array 42 may be configured in an alternative manner so that the sense amplifier 46 outputs a high level "1" during initialization. More specifically, the ferroelectric capacitors FCa of the unit cells UCa may be disconnected from the corresponding cell transistors Ta, and the ferroelectric capacitors FCb of the unit cells UCb may be connected to corresponding cell transistors Tb. Thus, when the word line WL1 or WL2 is selected, the capacitance of the selected true bit lines becomes smaller than that of the corresponding complement bit lines, so that output data of the sense amplifier 46 are initialized to the high level "1".

As described above, an RFID device consistent with the present invention includes a region of a memory cell array that may be initialized. Also, the region that needs initialization, e.g., regions 48a and 48b shown in FIGS. 4a, 4b, 6a, and 6b, is formed with the cell array and may be formed by the same process as the rest of the cell array.

Although FIGS. 4a, 4b, 6a, and 6b all show the region that needs to be initialized to include unit cells connected to four word lines, the number of word lines in the region that needs initialization is not limited to four, but rather depends on the specific applications the RFID tag is designed for.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. An RFID device having a nonvolatile ferroelectric memory, the nonvolatile ferroelectric memory comprising:
   a plurality of word lines; and
   a plurality of banks each including a cell array, the cell array of one of the banks including a region to be initialized, wherein the region includes a plurality of memory unit cells each including a ferroelectric capacitor, the memory unit cells being connected to the word lines,
   wherein the ferroelectric capacitor of a first one of the memory unit cells has a first terminal connected to a plate line and a second terminal connected to a cell transistor,
   the ferroelectric capacitor of a second one of the memory unit cells has a first terminal connected to a ground terminal, and
   the first one and the second one of the memory cells are respectively connected to a first one and a second one of the word lines, the first one and the second one of the word lines being connected to each other.

2. The RFID device of claim 1, wherein the nonvolatile ferroelectric memory further comprises:
   a plurality of pairs of bit lines;
   an equalization unit configured to equalize one pair of bit lines to a ground voltage level; and
   a sense amplifier configured to sense and amplify a voltage difference between the bit lines in one pair.

3. The RFID device of claim 1, wherein the ferroelectric capacitor of the second one of the memory unit cells has a second terminal that is floating.

4. The RFID device of claim 3, wherein the nonvolatile ferroelectric memory further comprises a plurality of pairs of bit lines, wherein each pair of bit lines includes a true bit line and a complement bit line, and wherein the first one of the memory units is initialized to a low level when the first one of the memory units is connected to the true bit line of one of the pairs of bit lines.

5. The RFID device of claim 3, wherein the nonvolatile ferroelectric memory further comprises a plurality of pairs of bit lines, wherein each pair of bit lines includes a true bit line and a complement bit line, and wherein the first one of the memory units is initialized to a high level when the first one of the memory units is connected to the complement bit line of one of the pairs of bit lines.

6. The RFID device of claim 1, wherein the nonvolatile ferroelectric memory has an open bit line structure.

7. The RFID device of claim 6, wherein the nonvolatile ferroelectric memory further comprises:
   a plurality of pairs of bit lines;
   an equalization unit configured to equalize one pair of bit lines; and
   a sense amplifier configured to sense and amplify a voltage difference on the bit lines in one pair.

8. The RFID device of claim 6, wherein the ferroelectric capacitor of the second one of the memory unit cells has a second terminal that is floating.

9. The RFID device of claim 6, wherein the nonvolatile ferroelectric memory further comprises a plurality of pairs of bit lines, wherein each pair of bit lines includes a true bit line and a complement bit line, and wherein the first one of the memory units is initialized to a low level when the first one of the memory units is connected to the true bit line of one of the pairs of bit lines.

10. The RFID device of claim 6, wherein the nonvolatile ferroelectric memory further comprises a plurality of pairs of bit lines, wherein each pair of bit lines includes a true bit line and a complement bit line, and wherein the first one of the memory units is initialized to a high level when the first one of the memory units is connected to the complement bit line of one of the pairs of bit lines.

11. The RFID device of claim 1, wherein the nonvolatile ferroelectric memory has a folded bit line structure.

12. The RFID device of claim 11, wherein the memory further comprises:
 a plurality of pairs of bit lines;
 an equalization unit configured to equalize one pair of bit lines; and
 a sense amplifier configured to sense and amplify a voltage difference on the bit lines in one pair.

13. The RFID device according to claim 11, wherein the ferroelectric capacitor of the second one of the memory unit cells has a second terminal that is floating.

14. The RFID device according to claim 11, wherein the ferroelectric capacitor of the second one of the memory unit cells has a second terminal connected to the second terminal of the ferroelectric capacitor of the first one of the memory unit cells.

15. The RFID device of claim 11, wherein the nonvolatile ferroelectric memory further comprises a plurality of pairs of bit lines, wherein each pair of bit lines includes a true bit line and a complement bit line, and wherein the first one of the memory units is initialized to a low level when the first one of the memory units is connected to the true bit line of one of the pairs of bit lines.

16. The RFID device of claim 11, wherein the nonvolatile ferroelectric memory further comprises a plurality of pairs of bit lines, wherein each pair of bit lines includes a true bit line and a complement bit line, and wherein the first one of the memory units is initialized to a high level when the first one of the memory units is connected to the complement bit line of one of the pairs of bit lines.

17. An RFID device having a nonvolatile ferroelectric memory, the nonvolatile ferroelectric memory comprising:
 a plurality of word lines; and
 a plurality of banks each including a cell array, the cell array of one of the banks including a region to be initialized, the region including a plurality of memory unit cells each including a ferroelectric capacitor, wherein the memory unit cells are connected to the word lines,
 wherein the ferroelectric capacitor of a first one of the memory unit cells has a first terminal connected to a plate line and a second terminal connected to a cell transistor;
 the ferroelectric capacitor of a second one of the memory unit cells has one terminal connected to a ground voltage, and
 the first one and the second one of the memory cells are respectively connected to a first one and a second one of the word lines, the first one and the second one of the word lines being selected by a same row address.

18. The RFID device of claim 17, wherein the nonvolatile ferroelectric memory has an open bit line structure.

19. The RFID device of claim 17, wherein the nonvolatile ferroelectric memory has a folded bit line structure.

* * * * *